United States Patent [19]

Tanisaka et al.

[11] Patent Number: 4,577,151
[45] Date of Patent: Mar. 18, 1986

[54] SPARK MONITOR DEVICE FOR CURRENT COLLECTORS

[75] Inventors: Satoshi Tanisaka, Nagasaki; Yoshihiro Michiguchi, Ibaraki, both of Japan

[73] Assignee: Hitachi, Ltd., Tokyo, Japan

[21] Appl. No.: 397,047

[22] Filed: Jul. 12, 1982

[30] Foreign Application Priority Data

Jul. 14, 1981 [JP] Japan .................. 56-108822

[51] Int. Cl.⁴ ............... G01R 31/02; G08B 21/00
[52] U.S. Cl. ............... 324/158 MG; 324/102; 340/648
[58] Field of Search ........... 324/158 MG, 102, 103 P, 324/103 R; 340/648, 662, 635; 317/21, 23, 33, 91; 310/219, 220

[56] References Cited

U.S. PATENT DOCUMENTS 2,752,589 6/1956 DeLong, Jr. .................. 324/103 R
4,058,804 11/1977 Sawada et al. ................. 340/635

FOREIGN PATENT DOCUMENTS 56-81063 7/1981 Japan .

OTHER PUBLICATIONS

Roumanis, S. J.; "The Null Point . . . "; AIEE Transactions; Apr. 1956; pp. 147–152.

Primary Examiner—Ernest F. Karlsen
Attorney, Agent, or Firm—Antonelli, Terry & Wands

[57] ABSTRACT

A spark monitor device arranged to detect a high frequency noise due to a spark generated in a current collector of a rotary electric machine and monitor a state of spark generation on the basis of the product of a peak value of the high frequency noise exceeding a given set value and a time interval during which the peak value exceeds the set value.

8 Claims, 11 Drawing Figures

SPARK MONITOR DEVICE FOR CURRENT COLLECTORS

The present invention relates to a spark monitor device for current collectors and more particularly to a device for monitoring sparks generated on the current collector ring or the commutating portion of a rotary electric machine.

In this field, a spark monitor device using phototube has been a known type of spark monitor device. This prior spark monitor device, however, involves various problems, such that a light receiving range of the light receiving section is limited and the sparks generated at the brush bottom can not be detected. Therefore, the device can not accurately monitor the generation of sparks under various conditions.

As disclosed in Japanese patent application No. 155661/79 filed on Dec. 3, 1979, entitled "Spark Monitor Device for Current Collectors", the monitor device has an antenna for detecting high frequency noise based on the spark generation and a counter for counting up "1" each time when the high frequency noise presents a peak value exceeding a predetermined set value and continuing longer than a predetermined time interval. The monitor device judges the presence or absence of substantial sparks on the basis of a count of the counter obtained during a unit time. This device employs a two-valued signal for representing the magnitude of the high frequency noise depending on whether it exceeds a predetermined set value or not. With the use of the two-valued signal the monitor device can detect a frequency of the spark generation but can not detect the power of sparks, which is useful information for determining a proper adjustment of the brush contact pressure and a timing in exchange of the brushes.

Accordingly, an object of the present invention is to provide a spark monitor device for current collectors which can reliably detect the presence or absence of sparks generated at the current collecting portion of the rotary electric machine as well as the spark power.

To achieve the above object, there is provided a device for monitoring sparks generated at the current collector of a rotary electric machine which comprises means for detecting high frequency noise caused by the generation of sparks, and means for generating a signal representing the state of the generated sparks on the basis of the product of a peak value of the spark noise exceeding a predetermined set value and a time interval during which the peak value of the high frequency exceeding the set value continues.

The present invention will be well understood from the following explanation of the embodiments of the invention with reference to the accompanying drawings in which.

Figures 1, 2:
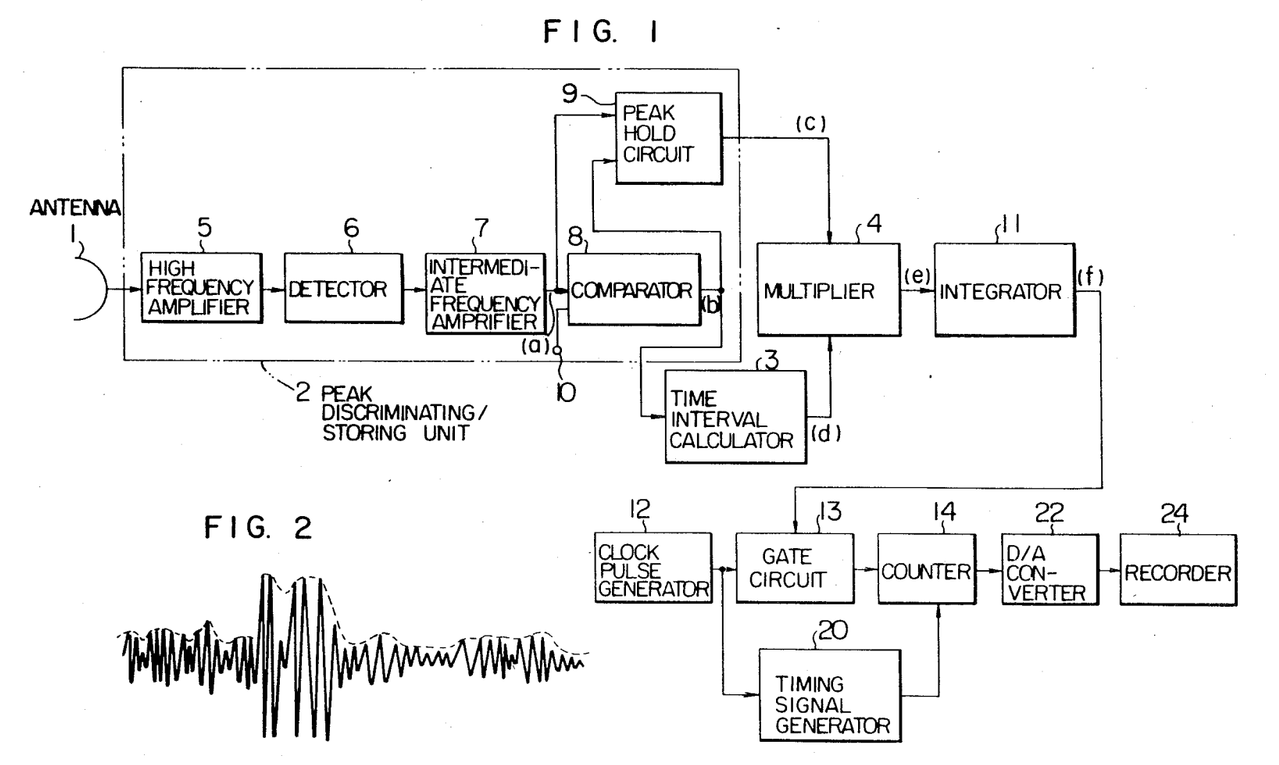
FIG. 1 is a block diagram of a circuit arrangement of an embodiment of the present invention.
FIG. 2 shows a typical waveform of a high frequency noise derived from the spark generation.

In FIG. 1, reference numeral 1 designates an antenna which is suitable for receiving high frequency noise due to the spark generation and is disposed in the current collector ring housing of a turbine generator, for example, or adjacent to the commutator of a DC machine. A peak discriminating/storing unit 2 discriminates and stores the peak value of the high frequency noise signal received by the antenna 1 when it exceeds a given set value. A time interval calculator 3 is provided to measure a time interval during which the amplitude of the high frequency noise continues to exceed the set value. Reference numeral 4 designates a multiplier. The peak discriminating/storing unit 2 is made up of a high frequency amplifier 5, a detector 6, an intermediate frequency amplifier 7, a comparator 8 and a peak hold circuit 9. The comparator 8 is provided with a set value input terminal 10.

Reference numeral 11 designates an integrator for generating a gate signal with a pulse width proportional to the output signal from the multiplier 3; 12 a clock pulse generator; 13 a gate circuit including AND gates, and 14 a counter.

Figure 3:
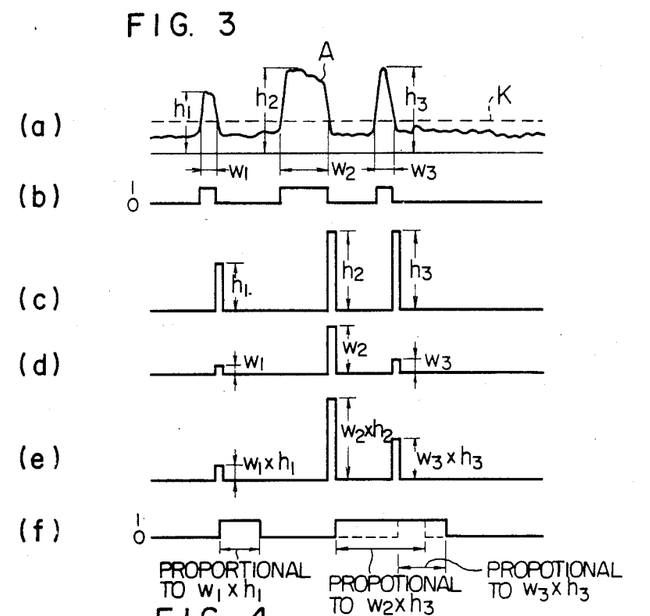
FIG. 3 shows waveforms of signals at various portions useful in explaining the operation of the embodiment shown in FIG. 1.

A high frequency noise signal derived from the spark generation has a waveform such as obtained by amplitude-modulating a carrier wave of generally 10 to 100 MHz with an intensity of the spark. In the peak discriminating/storing unit 2, the high frequency noise signal received by the antenna 1 is amplified by the high frequency amplifier 5, and the amplitude modulating components of generally several hundreds KHz corresponding to the spark intensity in the amplified high frequency signal is detected by the detector 6. The output signal is amplified by the intermediate frequency amplifier 7 to have a signal A as indicated by a solid line shown in FIG. 3(a). A reference signal having a level of a given set value K, as indicated by a broken line in FIG. 3(a), is applied to the set value input terminal 10 of the comparator 8. The comparator 8 compares the signal A with the reference signal K and produces a high level signal "1" as shown in FIG. 3(b) when the signal A exceeds the set value K. The peak hold circuit 9 receives the signal A from the intermediate amplifier 7 only when the output signal from the comparator 8 is at "1" level, and holds the peak value h, of the signal A received in each period during which the output of the comparator 8 continues "1". The peak hold circuit 9 produces a signal with an amplitude proportional to the peak value h, as shown in FIG. 3(c). The time interval calculator 3 measures the time interval W during which the output signal from the comparator continues "1" level, thereby to produce a signal with a pulse height corresponding to the time interval W, as shown in FIG. 3(d). The multiplier 4 multiplies the output signal from the peak hold circuit 9 by the output signal from the time interval calculator 3 to obtain the peak-time product corresponding to the spark power and to produce a signal with a height proportional to wh, as shown in FIG. 3(e).

The integrator 11 receives the output signal from the multiplier 4 and produces a signal which has a high level "1" continuing for a time interval proportional to the width wh, as shown in FIG. 3(f). If the multiplier produces an output signal having a relatively large amplitude wh, and then produces the succeeding output very soon, the integrator circuit 11 may produce a high level signal in response to the succeeding output of the multiplier, before the high level signal responsive to the preceding signal terminates. In this case, the two high level signals are overlapped, as will be described hereinafter, to provide a single continuous high level signal, as shown in FIG. 3(f). The output signal from the integrator 11 is applied to the gate circuit 13. The gate circuit 13 allows the pulses from the clock signal generator to go to the counter 14 for a time interval when the output signal from the integrated circuit exists. In response to a timing signal generated by a timing signal generator 20 each time it counts a given number of the clock pulses, the counter applies its counts to the D/A converter 22 and then is reset. The D/A converter 22 converts the received count value into an analog signal, which is in turn recorded by the recorder 24.

The peak hold circuit 9, the multiplier 4, and the integrator 11, which are used in the above embodiment, are known and hence detailed description thereof will be unnecessary. For example, the peak hold circuit may be made of a sample/hold element, such as Model AD583K, manufactured by ANALOG DEVICES CO. in U.S.A. The multiplier 4 masy be made of a multiplier/division element such as Model AD532KH manufactured by the same company. The integrator can be constructed as shown in FIG. 4.

Figure 4:
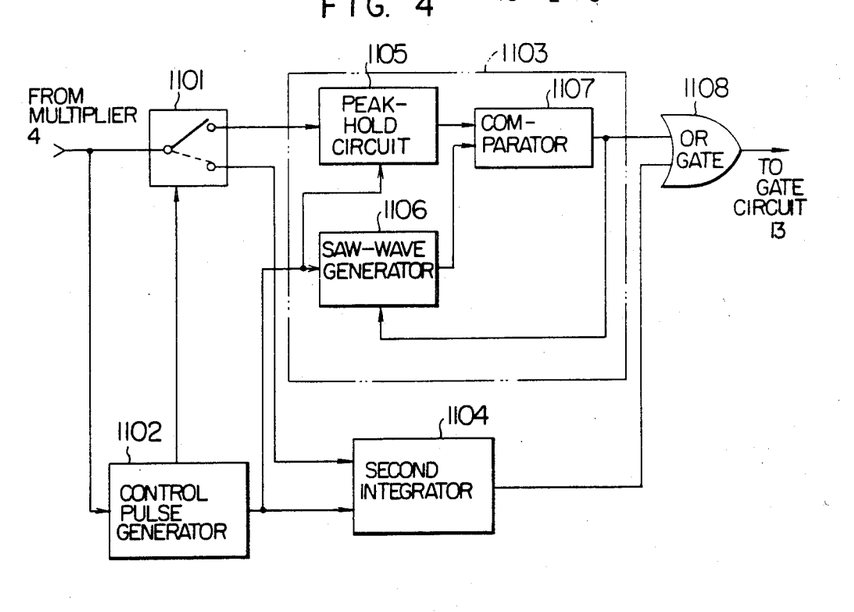
FIG. 4 is a block diagram of a circuit arrangement of an integrating circuit used in the embodiment shown in FIG. 1.

In FIG. 4, a changeover switching circuit 1101 responds to a control pulse generated by a control pulse generator 1102 to change its connection between two positions as indicated by a solid line and a dotted line and allows the output signal from the multiplier 4 to alternately go to a first integrator or a second integrator. Since the circuit arrangements of the first and second integrators 1103 and 1104 are identical to each other, only the first integrator 1103 will be described. When the switching circuit 1101 is positioned as indicated by the solid line in response to the control pulse from the control pulse generator 1102, the output signal from the multiplier 4 is transferred to the first integrator 1103. The control pulse is also applied to the peak hold circuit 1105 so that it holds the peak value of the output signal from the multiplier 4, and simultaneously to a sawtooth wave signal generator 106 thereby to cause it to start the generation of a sawtooth wave which monotonously rises with a predetermined constant slope. The comparator 1107 compares the signal held by the peak hold circuit 1105 with the sawtooth signal from the sawtooth signal generator. The comparator produces a signal of high level "1" when the former is higher than the latter, that is, for a time interval proportional to the peak wxh of the output signal from the multiplier 4. When the output signal from the comparator is rendered low level, the sawtooth wave signal generator 1106 is reset. Then, the switching circuit 1101 is turned to the other position as indicated by the dotted line and the output signal from the multiplier 4 is applied to the second integrator 1104, which then produces a signal of high level "1" in a similar manner for a time interval proportional to the peak wxh of the applied signal. Both the high level signals are applied through an OR gate 1108 to the gate 13. Therefore, when the high level signals are partially overlapped, these signals provide a waveform as if one of these signals becomes ineffective at the overlapped portion, as indicated by a waveform on the right side in FIG. 3(f).

As above-mentioned, when the output signals from the first and second integrators are overlapped, one of the output signals is made invalid at the overlapped portion. As a result, it is impossible to correctly indicate the spark condition. In an embodiment shown in FIG. 5, the output signals from the first and second integrators 1103 and 1104 are processed so as to make both of the signals valid even when these signals are overlapped. In more particular, when the output signal from the first integrator 1103 shown in FIG. 4 is at high level "1", the clock pulse generated by the clock pulse generator 12 is applied through a first gate circuit 1301 to a first counter 1401. The first counter 1401 counts clock pulses during a predetermined unit time interval determined by the timing signal generated by the timing signal generator 20. When the unit time interval terminates, the counter transfers its count value to an adder 1404, and is reset. Similarly, when a second counter 1402 also counts the clock pulses received when the output signal from a second integrator 1104 is at a high level "1" and upon receipt of the timing signal, applies its count value to the adder 1404 and is reset. The adder 1404 adds the input signals and applies the result of the addition to the D/A converter. The adder 1404 is reset by the timing signal after a time delay necessary for the process of addition. Thus, in the present embodiment, the output signals from the first integrator 1103 and the second integrator 1104 are independently processed and added. As a result, even if both the output signals are overlapped, any one of the output signals is not made invalid at the overlapped portion.

Figure 5:
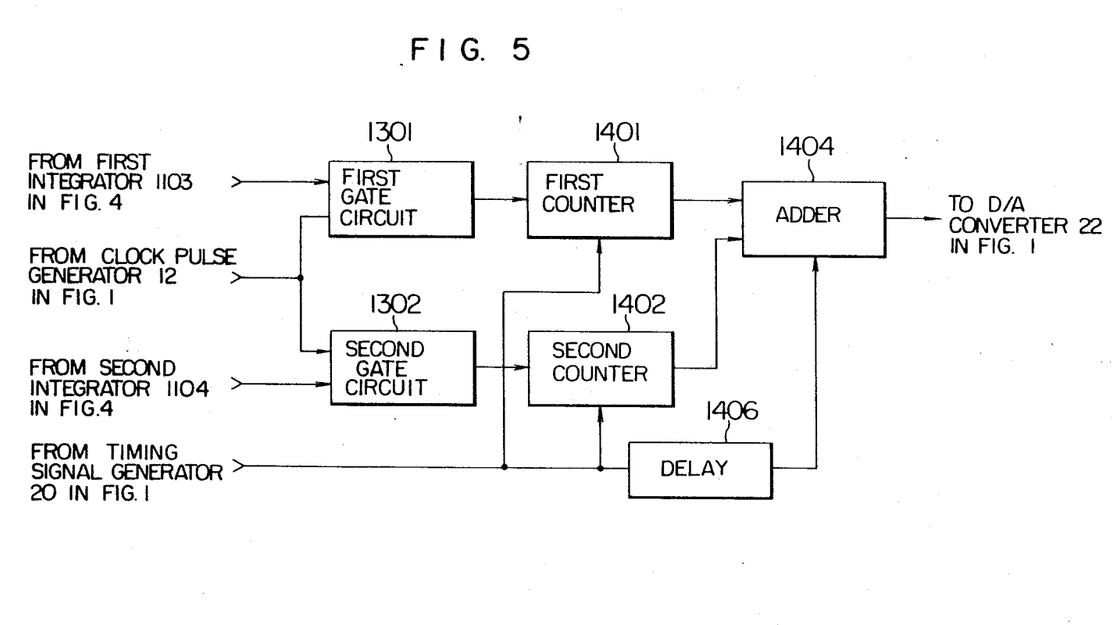
FIG. 5 is relating to a second embodiment of the present invention which is a modification of the embodiment of FIG. 1, and shows the circuit arrangement in block diagram, of the modified part.

While the embodiments shown in FIGS. 4 and 5 employ two integrators 1103 and 1104, it is evident that more than two integrators may be used, if necessary.

Figure 6:
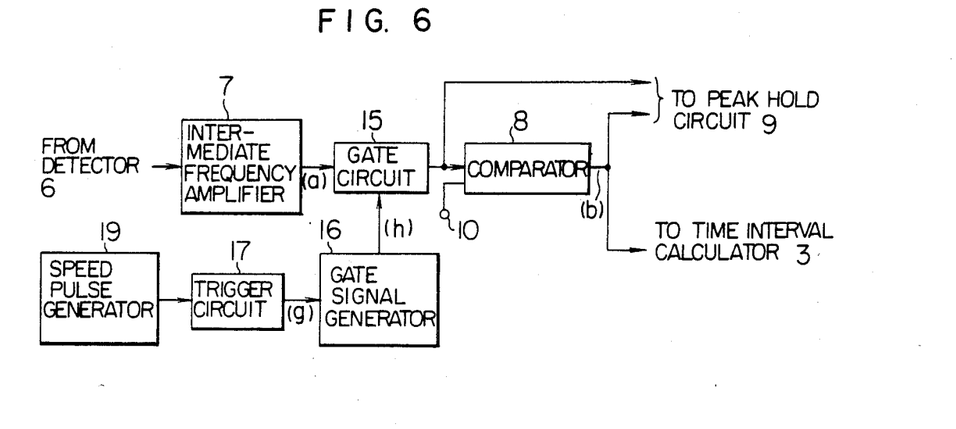
FIG. 6 is a block diagram of a circuit arrangement of the modified part of another modification of the embodiment shown in FIG. 1.

Referring to FIG. 6 relating to another embodiment of the present invention which is a modification of the embodiment shown in FIG. 1, there is shown a circuit arrangement of the modified portion. In the figure, like reference numerals are used for designating like portions in FIG. 1. In this embodiment, which is arranged to monitor the spark generation at a specific angular range of the rotor a gate circuit 15 is provided between the intermediate frequency amplifier 7 and the comparator 8 in FIG. 1 so that the output signal from the amplifier 7 is selectively applied to one of the input terminals of the comparator 8. The gate circuit 15 is connected to a speed pulse generator 19 through a trigger circuit 17 and a gate signal generator 16.

Figure 7:
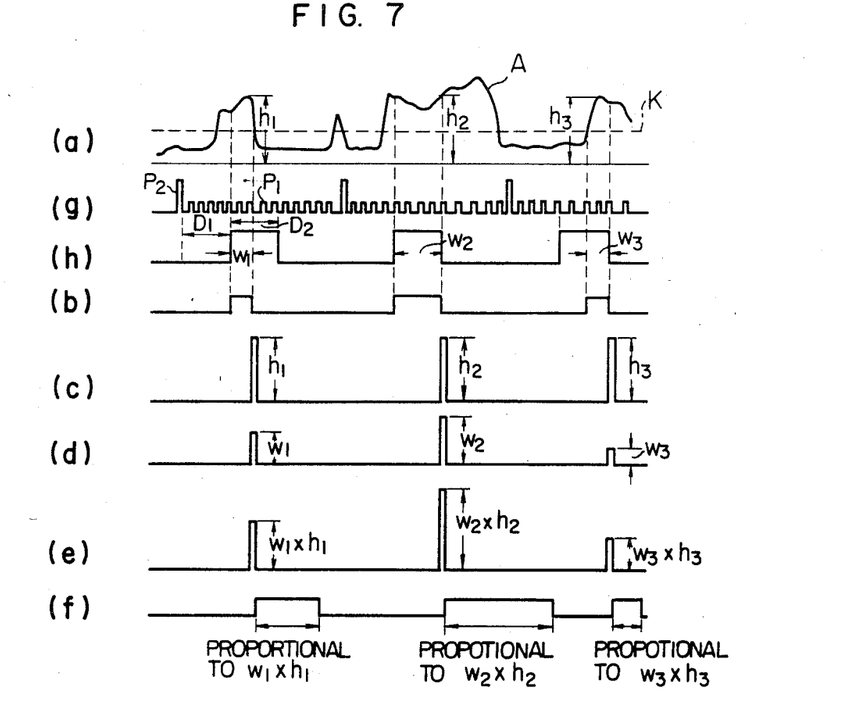
FIG. 7 shows waveforms of various portions useful in explaining the operation of the embodiment shown in FIG. 6.

The operation of this embodiment will be described referring to FIG. 7. The speed pulse generator 19 is connected to rotate in synchronism with the rotation of the rotor of the rotary electric machine thereby to produce a pulse signal at a frequency proportional to the rotating speed of the rotor and a pulse signal indicating a specific reference angular position of the rotor. Then, the trigger circuit 17 waveshapes these pulse signals to produce pulses P1 and P2, as shown in FIG. 7(g). The amplitude of the pulse P2 is sufficiently larger than that of the pulse P1 so that the pulse P2 is clearly distinguished from the pulse P1. The gate signal generator 16, upon receipt of the pulse P2, starts its operation to count the pulses P1 and produces a gate signal, as shown in FIG. 7(h), which rises to a high level "1" when the count reaches a given value D1, and falls to a low level "0" when it further counts another predetermined number D2 of the pulses P1. The values D1 and D2 are so selected that the gate signal (h) generates when the rotor is positioned within the given angular range to be monitored. When the gate signal is at "1" level, the gate circuit 15 allows the output signal A of the intermediate frequency amplifier 7 shown in FIG. 7(a) to pass therethough to the comparator 8. The comparator 8 produces a signal, as shown in FIG. 7(b), which becomes high in level when the amplitude of the input signal A exceeds the set value K. The subsequent operation is similar to that of the embodiment shown in FIGS. 1 and 2.

This embodiment is so designed as to monitor the spark generation only when the rotor of the rotary electric machine is positioned within a specific angular range where the spark tends to generate. This is effective to improve the efficiency of monitoring the spark generation.

Figure 8:
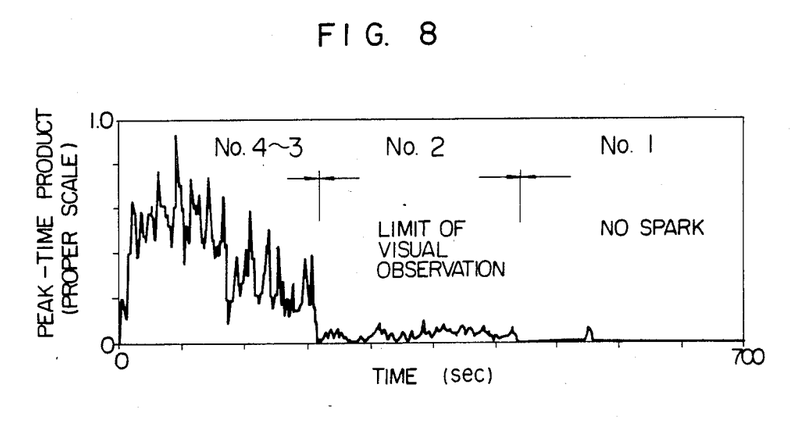
FIG. 8 shows a graph for comparing measured data obtained by the embodiment of FIG. 1 with the results of the visual observation.

FIG. 8 comparatively illustrates the result of visual observation of sparks generated in a rotary electric machine and the recording result measured by the recorder of the spark monitor device of the present invention. In the graph, the abscissa represents time and the ordinate a value of the peak-time product. There are shown four different degrees of spark generation as designated by Nos. 1 to 4. Here, the spark number indicates an index representing an intensity of the spark determined by visual observation. Accordingly, the larger the spark number, the higher the intensity of the spark. Specifically, the spark No. 1 indicates the spark which can hardly be observed or substantially no spark. As seen from FIG. 8, a value of the peak-time product obtained by the spark monitor device according to the present invention corresponds to a spark intensity or power, and hence the value of the peak-time product can be used to indicate the spark intensity or power.

Figure 9:
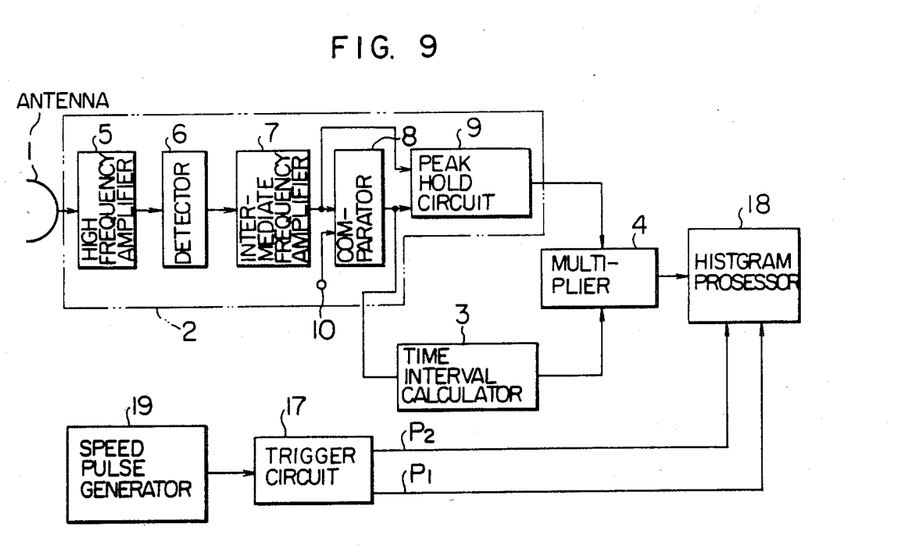
FIG. 9 is a block diagram of a circuit arrangement of another embodiment of the present invention.
Figure 10:
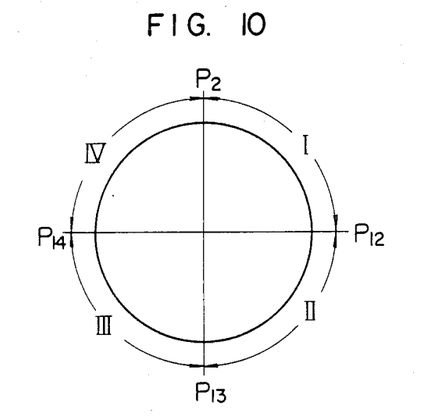
FIG. 10 shows an explanatory diagram for illustrating the principle of a histogram processing arrangement used in the embodiment of FIG. 9.
Figure 11:
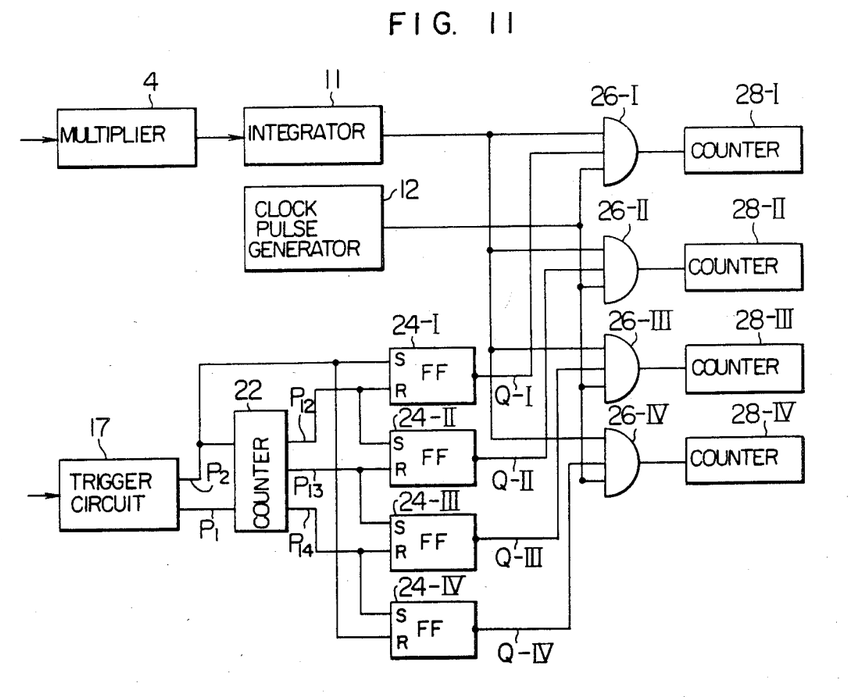
FIG. 11 is a block diagram of an arrangement of a histogram processing circuit used in the embodiment of FIG. 9.

Yet another embodiment of the present invention will be described referring to FIG. 9. In the figure, like numerals indicate like portions in FIG. 1 or 2. This embodiment additionally uses a device 18 for histogram-processing the peak-time product represented by the output from the multiplier 4. In this embodiment, the one rotation period of the rotor is divided into a plurality of segments. The output signals from the multiplier 4 generated when the rotor is moving in each of the segments are accumulated. When the one rotation period of the rotor is divided, for example, into four segments I to IV, as shown in FIG. 10, the histogram processor may be constructed as shown in FIG. 11. As in the embodiment of FIG. 6, the trigger circuit 17 generates a pulse signal P1 with a frequency proportional to a rotating speed of the rotor and another pulse signal P2 representing a specific reference angular position of the rotor, as shown in FIG. 7(g). The counter 22 is reset by the pulse P2 and then counts the pulses P1. The counter 22 produce a pulse P12 when the counter counts up to a value equal to the number of pulses P1 generated when the rotor rotates over asn angle corresponding to the segment 1. Likewise, the counter produces pulses P13 and P14 successively when the rotor rotates over the respective angles corresponding to the segments II and III. The flip-flop 24-I is set by the pulse P2 and reset by the pulse P12. The output signal Q-I from the flip-flop is at a high level "1" when the rotor is within the segment I, and in a low level when it is within any of the remaining segments. Similarly, the output signals Q-II to Q-IV of the flip-flops 24-II to 24-IV are kept at high level so long as the rotor passes the segments II to IV, respectively. The integrator 11, like the integrator 11 in FIG. 1, generates a signal of high level continuing a time interval proportional to w x h, as shown in FIG. 3(f). An AND gate 26-I allows the clock pulses to pass therethrough when the output signal from the integrator 11 and the output signal Q-I from a flip-flop 24-I are both at high level "1", and the counter 28 accumulatively counts the clock pulses. Accordingly, the count of the counter 28-I corresponds to the accumulation of the peak-time produce relating to the sparks generated by the rotor located within the segment I. Similarly, the counts of counters 28-II to 28-IV correspond to the accumulations of the peak-time products relating to the sparks generated by the rotor located within the segments II to IV, respectively.

In this embodiment, the sparks repeatedly generated in the same angular ranges in the rotation of the rotor can be detected, even if the power of each spark is small, from the large value of accumulation.

While the above-mentioned embodiment employs the peak value of the high frequency noise measured from zero level, the peak value measured relative to any set value may of course be used with the same effect.

As described above, the spark monitor device according to the present invention can obtain not only the information of presence or absence of the spark generation but also the power or intensity thereof and hence can monitor accurately the condition of spark generation.

What is claimed is:

1. A device for monitoring sparks generated at a current collector in a rotary machine comprising:
   means for receiving high frequency noise derived from sparks generated at the current collector and producing a first signal corresponding to an amplitude modulating component detected from said high frequency noise;
   means connected to said high frequency noise receiving means for detecting a higher level portion of said first signal where said first signal continuously exceeds a predetermined set value;
   means coupled to said higher-level portion detecting means for determining a time interval during which said higher-level portion continues; and
   means connected to said higher-level portion detecting means and to said time interval determining means for generating a second signal of a level corresponding to a multiplication product of a maximum value in said higher-level portion of said first signal and said time interval determined by said time interval determining means, said second signal being representative of the state of the generated sparks.

2. A spark monitor device according to claim 1, in which said higher-level portion detecting means includes:

peak discriminating/storing means for detecting the maximum value of said higher-level portion and storing the detected maximum value.

3. A spark monitor device according to claim 2, further including means for producing an integration, when a plurality of such higher-level portions are detected during a predetermined unit time interval, of the second signals relating to said plurality of higher-level portions, respectively.

4. A spark monitor device according to claim 3, further including means for making operative said peak discriminating/storing means only when a rotor of the rotary electric machine is located within a predetermined angular range in rotation.

5. A spark monitor device according to claim 2, further including:
means for defining a plurality of discrete segments according to angular ranges in rotation of a rotor of the rotary electric machine, and
means for accumulating the second signals produced when said rotor is repeatedly passing through each of said discrete segments, thereby to provide the respective accumulations of the second signals relating to the respective segments.

6. A spark monitor device according to claim 3, in which said integration producing means includes means for producing digital values corresponding to the second signals, respectively, and means for integrating said digital values produced and producing the result of said integration at the end of said unit time interval.

7. A spark monitor device according to claim 6, in which said digital value producing means includes a plurality of integrators each for receiving the second signal supplied thereto and producing a signal of one of two levels which continues for a time interval corresponding to the level of said supplied second signal, means for supplying the successive second signals to said integrators successively in a predetermined order, a gate circuit connected between a clock pulse generator and a counter and also connected to said integrators to receive the signals of the one level from said integrators, so that the clock pulses produced by said pulse generator are counted by said counter in the presence of any of said signals of the one level.

8. A spark monitor according to claim 6, in which said digital value producing means includes a plurality of integrators each for receiving the second signal supplied thereto and producing a signal of one of two levels which continues for a time interval corresponding to the level of said supplied second signal, means for supplying the successive second signals to said integrators successively in a predetermined order, gate circuits each provided to each of said integrators and connected to a clock pulse generator for allowing clock pulses generated by said clock pulse generator to pass therethrough when the associated integrator produces said signal of said one level, and a counter connected to each of said gate circuits for counting the clock pulses supplied through said gate circuit during said unit time interval, and wherein said digital value integrating means includes an adder for adding the counts of said counters.

* * * * *